United States Patent
Smet et al.

(10) Patent No.: US 9,556,349 B2
(45) Date of Patent: Jan. 31, 2017

(54) RADIATION CURABLE ETCH RESISTANT INKJET INK PRINTING

(71) Applicant: AGFA-GEVAERT, Mortsel (BE)

(72) Inventors: Stefaan Smet, Mortsel (BE); Freddy Zutterman, Mortsel (BE); Peter Vermeersch, Mortsel (BE); Johan Loccufier, Mortsel (BE); Ann Willems, Mortsel (BE)

(73) Assignee: AGFA-GEVAERT, Mortsel (BE)

( * ) Notice: Subject to any disclaimer, the term of this patent is extended or adjusted under 35 U.S.C. 154(b) by 113 days.

(21) Appl. No.: 14/370,253

(22) PCT Filed: Jan. 18, 2013

(86) PCT No.: PCT/EP2013/050943
§ 371 (c)(1),
(2) Date: Jul. 2, 2014

(87) PCT Pub. No.: WO2013/113572
PCT Pub. Date: Aug. 8, 2013

(65) Prior Publication Data
US 2014/0363632 A1     Dec. 11, 2014

Related U.S. Application Data

(60) Provisional application No. 61/593,338, filed on Feb. 1, 2012.

(30) Foreign Application Priority Data

Jan. 31, 2012  (EP) .................................... 12153196

(51) Int. Cl.
| | | |
|---|---|---|
| C09D 11/328 | (2014.01) | |
| B41J 11/00 | (2006.01) | |
| C09D 11/30 | (2014.01) | |
| C09D 11/326 | (2014.01) | |
| C23F 1/02 | (2006.01) | |
| C09D 11/101 | (2014.01) | |
| G03F 1/00 | (2012.01) | |
| B44C 1/22 | (2006.01) | |

(52) U.S. Cl.
CPC ............ *C09D 11/328* (2013.01); *B41J 11/002* (2013.01); *C09D 11/101* (2013.01); *C09D 11/30* (2013.01); *C09D 11/326* (2013.01); *C23F 1/02* (2013.01); *B44C 1/227* (2013.01); *G03F 1/0023* (2013.01); *Y10T 428/24612* (2015.01)

(58) Field of Classification Search
CPC ..... C09D 11/328; C09D 11/30; C09D 11/326; C09D 11/101; B41J 11/002; C23F 1/02; G03F 1/0023; B44C 1/227; Y10T 428/24612

See application file for complete search history.

(56) References Cited

U.S. PATENT DOCUMENTS

| | | | |
|---|---|---|---|
| 5,270,368 A | 12/1993 | Lent et al. | |
| 2004/0132862 A1* | 7/2004 | Woudenberg | C09D 11/34 522/75 |
| 2007/0122723 A1* | 5/2007 | Hopper et al. | C09D 11/101 216/13 |
| 2010/0047457 A1* | 2/2010 | Bentley | C09D 11/101 427/280 |
| 2010/0092736 A1* | 4/2010 | Nishikawa | B41M 7/0081 428/195.1 |
| 2011/0012103 A1* | 1/2011 | Yang et al. | H01L 21/02554 257/43 |
| 2011/0024392 A1 | 2/2011 | Sato et al. | |
| 2013/0116358 A1* | 5/2013 | Rrahimi | C09D 11/101 522/8 |

FOREIGN PATENT DOCUMENTS

| | | | | |
|---|---|---|---|---|
| EP | 1911814 A1 * | 4/2008 | | C08F 2/50 |
| JP | 05-275852 A * | 10/1993 | | |
| WO | 2004/046260 A2 | 6/2004 | | |
| WO | 2004/106437 A1 | 12/2004 | | |

OTHER PUBLICATIONS

Official Communication issued in International Patent Application No. PCT/EP2013/050943, mailed on Apr. 17, 2013.

* cited by examiner

*Primary Examiner* — Anita Alanko
(74) *Attorney, Agent, or Firm* — Keating and Bennett, LLP

(57) ABSTRACT

An inkjet printing radiation curable inkjet ink for forming a protective layer during an etching process includes at least 70 percent by weight of a polymerizable composition based on the total weight of radiation curable inkjet ink, wherein the polymerizable composition has an oxygen fraction OFR>0.250 and a weighted polymerizable functionality WPF≥0.0050, and the polymerizable composition contains no polymerizable compound with an ethylenic double bond and including a phosphoester group or a carboxylic acid group in the molecule thereof.

8 Claims, No Drawings

RADIATION CURABLE ETCH RESISTANT INKJET INK PRINTING

CROSS-REFERENCE TO RELATED APPLICATIONS

This application is a 371 National Stage Application of PCT/EP2013/050943, filed Jan. 18, 2013. This application claims the benefit of U.S. Provisional Application No. 61/593,338, filed Feb. 1, 2012, which is incorporated by reference herein in its entirety. In addition, this application claims the benefit of European Application No. 12153196.6, filed Jan. 31, 2012, which is also incorporated by reference herein in its entirety.

BACKGROUND OF THE INVENTION

1. Field of the Invention

The present invention relates to inkjet printing of radiation curable inkjet inks that are etch resistant.

2. Description of the Related Art

Etching is the process of using a chemical, usually a strong acid or mordant, to cut into the unprotected parts of a metal surface in order to create a conductive pattern, e.g. a printed circuit board, or a design for decorative purposes.

Printed circuit boards are generally made by bonding a layer of copper over the entire substrate, applying a temporary mask and removing by etching unwanted copper leaving only the desired conductive copper pattern.

The temporary mask can be made by screen printing etch resistant ink onto the copper foil. The screen printing method by nature has low resolution and requires a relatively high viscosity for avoiding adverse phenomena such as bleeding and smudges.

Another method to provide a temporary mask is photoengraving. A photomask is usually prepared by laser-printing an image onto a transparent film using computer-aided manufacturing software. After exposing the photoresist coating on the copper foil through the photomask, a developer removes the non-exposed photoresist coating. Although high-resolution conductive patterns can be made, this method results in extra cost and chemical waste. Direct laser imaging techniques were developed which reduced the chemical waste.

U.S. Pat. No. 5,270,368 (VIDEOJET) discloses a UV curable, etch-resistant ink for inkjet printing circuit boards comprising a resin formulation having at least two acrylate components, one of which is an aromatic acrylate having a pendant carboxyl group and one of which is an acrylated epoxy monomer or dimer, a photoinitiator and an organic carrier. The preferred organic carrier of methanol and methyl ethyl ketone is employed in a range of 40% to 90% by weight of the ink composition. These volatile organic solvents lead to latency problems of inkjet print heads making reliable inkjet printing in an industrial environment process problematic. Reducing the amount of organic solvent leads to a too high ink viscosity, because some aromatic acrylate compounds traditionally used for preparing photoresist coatings have very high viscosity. For example, the bisphenol A ethoxylated diacrylate (Photomer™ 4028) used in all the examples of U.S. Pat. No. 5,270,368 (VIDEOJET) has a viscosity of 800 to 1200 mPa·s at 25° C. These aromatic acrylate compounds are essential for having a good balance in adhesion so that the printed ink layer is etch resistant yet easily removable after etching, especially since many different etching conditions and etchants are used in industry.

In another approach, polymerizable acidic compounds are included in the radiation curable ink to promote adhesion to the metal surface. For example US 2011024392 A (NISSHIN STEEL & TOKYO PRINTING INK MFG CO) discloses an etch resist inkjet ink having excellent adhesion to metallic plates by including a specific polymerizable phosphoric ester compound, a polyfunctional monomer having two or more ethylenic double-bond groups per molecule and having no phosphoric ester group and a monofunctional monomer having one ethylenic double-bond group per molecule and having neither phosphoric ester group nor carboxy group.

WO 2004106437 A1 (AVECIA) discloses a process for etching a metal or alloy surface which comprises applying an etchresistant ink by ink jet printing to selected areas of the metal or alloy, exposing the etch-resistant ink to actinic radiation and/or particle beam radiation to effect polymerisation, optionally thermally treating the etch-resistant ink and then removing the exposed metal or alloy by a chemical etching process wherein the etch-resistant ink is substantially solvent-free. All the disclosed etch-resistant inks include an acidic polymerizable compound.

WO 2004462260 A2 (MARKEM) discloses a radiation-curable hot melt ink composition comprising: a colorant; a polymerizable monomer; and a photoinitiating system comprising 0.5-1.5% by weight of an aromatic ketone photoinitiator, 2-10% by weight of an amine synergist, 3-8% by weight of an alpha-cleavage type photoinitiator, and 0.5-1.5% by weight of a photosensitizer.

However, the inclusion of acidic polymerizable compounds has some undesirable side effects such as increased viscosity and decreased ink stability and curing speed.

Hence, there remains a need for improved low viscous radiation curable inkjet inks suitable for reliable inkjet printing in an (industrial) etching process and applicable to a wide range of etchants and etching conditions.

SUMMARY OF THE INVENTION

It was surprisingly found that the above cited problems could be solved by radiation curable inkjet inks including at least 70 percent by weight of a polymerizable composition based on the total weight of radiation curable inkjet ink, wherein the polymerizable composition was controlled to have a minimum oxygen content and cross linking capability, and without the need of an acidic monomer for improving adhesion to the metal surface.

Preferred embodiments of the invention have been realised with a method of inkjet printing as defined below.

Further preferred embodiments of the invention will become apparent from the description hereinafter.

DETAILED DESCRIPTION OF THE PREFERRED EMBODIMENTS

Definitions

The term "radiation curable ink" means that the ink is curable by UV radiation or by e-beam.

The term "alkyl" means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethyl-propyl and 2-methyl-butyl etc.

The term "monofunctional monomer" means a monomer having only one polymerizable group, for example an acrylate group.

The term "polyfunctional monomer" means a monomer having two, three or more polymerizable groups, e.g. two acrylate groups and one vinyl ether group.

The term "polyacrylate" means a monomer having two, three or more acrylate groups.

Methods of Inkjet Printing

A method of inkjet printing according to a preferred embodiment of the present invention includes the steps of:
a) forming a protected area on a metal surface by printing and curing a radiation curable inkjet ink on the metal surface;
b) removing metal from the unprotected area of the metal surface by etching; and
c) removing at least partially the cured radiation curable inkjet ink from the protected area of the metal surface; characterized in that the radiation curable inkjet ink includes at least 70 percent by weight of a polymerizable composition based on the total weight of radiation curable inkjet ink, wherein the polymerizable composition has an oxygen fraction OFR>0.250 and a weighted polymerizable functionality WPF≥0.0050, $$\text{wherein } OFR = \sum_{i=1}^{n} \frac{15.9994 \times N_{O,i} \times \% \ wt_i}{MW_i \times \% \ wt_P}$$

and $$WPF = \sum_{i=1}^{n} \frac{N_{P,i} \times \% \ wt_i}{MW_i \times \% \ wt_P}$$

with:
n=the number of polymerizable compounds in the polymerizable composition having a different chemical structural formula;
$N_{O,i}$=the number of oxygen atoms in polymerizable compound i;
$N_{P,i}$=the number of polymerizable groups in polymerizable compound i;
$MW_i$=the molecular weight of the polymerizable compound i;
% $wt_i$=the weight percentage of the polymerizable compound i based on the total weight of the radiation curable inkjet ink; and
% $wt_P$=the weight percentage of the polymerizable composition based on the total weight of the radiation curable inkjet ink, and
wherein the polymerizable composition contains no polymerizable compound with an ethylenic double bond and including a phosphoester group or a carboxylic acid group in the molecule thereof.

The manner to calculate the oxygen fraction OFR and the weighted polymerizable functionality WPF is exemplified here below. If a radiation curable inkjet ink contains a single polymerizable compound in the polymerizable composition of radiation curable inkjet ink, then the value of i and n are both 1.

Assumed that the radiation curable inkjet ink contains % $wt_P$=80 wt % of a polymerizable composition consisting of two (n=2) monomers A and B present in an amount of % $wt_1$=30 wt % respectively % $wt_2$=50 wt % all based on the total weight of the radiation curable inkjet ink.

Monomer A is 2-(2'-vinyloxyethoxy)ethylacrylate having a molecular weight $MW_1$ of 186.21 and containing 4 oxygen atoms ($N_{O,1}$=4) and 2 polymerizable groups, i.e. an acrylate group and a vinylether group, so that $N_{P,1}$=2.

Monomer B is dipropylene glycol diacrylate having a molecular weight $MW_1$ of 242.27 and contains 5 oxygen atoms ($N_{O,2}$=5) and 2 polymerizable groups, i.e. two acrylate groups, so that $N_{P,2}$=2.

This results in:

OFR=[(15.9994×4×30)/(186.21×80)]+[(15.9994×5× 50)/(242.27×80)]=0.129+0.206=0.335 and

WPF=[(2×30)/(186.21×80)]+[(2×50)/(242.27×80)]= 0.0040+0.0052=0.0092

Metal Surfaces

There is no limitation on the nature of the metal surface. The metal surfaces preferably consist of copper, aluminium, nickel, iron, tin, titanium or zinc, but may be also be alloys including these metals. In a very preferred embodiment, the metal surface is made of copper. Copper has a high electrical conductivity and is a relatively cheap metal, making it very suitable for making printed circuit boards.

The metal surface may be self-supporting or may be present on a support. The support can be a non-flexible support as conventionally used in the production of PCB's, but may also be a flexible substrates made of e.g. polyethylene terephthalate or polyimide.

Self supporting metal surfaces are generally used when a decorative metal panel is made. Such a decorative metal panel may serve a purpose other than being purely decorative, such as providing information. For example, an aluminium name plate wherein the etch resistant radiation curable inkjet ink was printed as information, such as a name of a person or a company, and then removed to result in a glossy shiny name on a mat etched background, is also considered a decorative metal panel including a decorative element.

In another embodiment of a decorative metal panel, the metal surface is not self-supporting and when removed by etching exposes the color of or the information on the support.

In a preferred embodiment of the inkjet printing method, the metal surface is cleaned before printing the radiation curable inkjet ink. This is especially desirable when the metal surface is handled by hand and no gloves are worn. The cleaning removes dust particles and grease which can interfere in the adhesion of the radiation curable inkjet ink to the metal surface.

Etching

Etching of a metal surface, as in step b) of the inkjet printing method, is performed by using an etchant. The etchant is preferably an aqueous solution having a pH<3 or wherein 8<pH<10.

In a preferred embodiment, the etchant is an acid aqueous solution having a pH of less than 2. The acid etchant preferably includes at least one acid selected from the group consisting of nitric acid, picric acid, hydrochloric acid, hydrofluoric acid and sulfuric acid.

Preferred etchants known in the art include Kalling's No 2, ASTM No 30, Kellers Etch, Klemm's Reagent, Kroll's Reagent, Marble's Reagent, Murakami's Reagent, Picral and Vilella's Reagent.

In another preferred embodiment, the etchant is an alkaline aqueous solution having a pH of no more than 9. The alkaline etchant preferably includes at least one base selected from the group consisting of ammonia or ammonium hydroxide, potassium hydroxide and sodium hydroxide.

The etchant may also contain a metal salt such as copper dichloride, copper sulphate, potassium ferricyanide and iron trichloride.

Etching is preferably performed in a time frame of seconds to a few minutes, more preferably 5 to 100 seconds. Etching is preferably performed at room temperature (20° C.)

Etching is preferably followed by rinsing with water to remove any residual etchant.

Stripping

After etching, the cured radiation curable inkjet ink must at least partially be removed from the metal surface, so that e.g. electric or electronic devices can make contact with the remaining metal surface (conductive pattern) or that the decorative feature of an etched metal panel becomes fully visible. For example, an electronic component such as a transistor must be able to make electrical contacts with the conductive (copper) pattern on the printed circuit board. In a preferred embodiment, the cured radiation curable inkjet ink is completely removed from the metal surface.

In a preferred embodiment, the cured radiation curable inkjet ink is removed from the protected area in step c) by an alkaline stripping bath. Such an alkaline stripping bath is usually an aqueous solution with a pH>10.

In a more preferred embodiment, the cured radiation curable inkjet ink is removed from the protected area in step c) by dry delamination. This technique of "dry stripping" is currently unknown in the art of manufacturing printed circuit boards and introduces several ecological and economical advantages in the manufacturing process. Dry stripping not only eliminates the need of a corrosive alkaline stripping bath and its inherent liquid waste, but also allows for a higher throughput. Dry stripping can be implemented, for example, by using an adhesive foil and a roll-to-roll laminator-delaminator. The adhesive foil is first laminated with its adhesive side onto the cured radiation curable inkjet ink present on the metal surface and subsequently delaminated thereby removing the cured radiation curable inkjet ink from the metal surface. Delamination by a roll-to-roll laminator-delaminator can be performed in seconds, while alkaline stripping takes minutes.

INDUSTRIAL APPLICABILITY

In one preferred embodiment, the inkjet printing method of the present invention is used in a method for manufacturing a conductive pattern, such as a PCB. The conductive pattern corresponds to the cured radiation curable inkjet ink having an oxygen fraction OFR>0.250 and a weighted polymerizable functionality WPF≥0.0050.

It was found that inks including a polymerizable composition having an oxygen fraction OFR≤0.250 and a weighted polymerizable functionality WPF≤0.0055, exhibited good etch resistance but no strippability. Although these inks are useless as etch resistant ink for creating a conductive pattern of a printed circuit board, they can be used as a so-called "legend ink". The legend, or nomenclature as it is also known, is in the form of letters and numbers which aid the assembly and identification of component positions. The device part number, orientation or pin one locator is usually printed with a white or yellow legend ink. By printing the legend inkjet ink and the etch resistant inkjet ink simultaneously on a copper plate, with the legend inkjet ink being printed in a position not covering the conductive pattern or copper circuitry, a simpler and cost-effective manufacturing process of printed circuit boards can be realized.

A solder mask is a polymeric layer providing a permanent protective coating for the copper traces of a printed circuit board (PCB) and prevents solder from bridging between conductors, thereby preventing short circuits. Solder mask is traditionally green but is now available in many colors. In the preferred embodiment where also a legend inkjet ink including a polymerizable composition having an oxygen fraction OFR≤0.250 and a weighted polymerizable functionality WPF=0.0055 is inkjet printed on the metal surface, the solder mask is preferably translucent or transparent, most preferably transparent. The advantage of using a transparent solder mask is that the letters and numbers of the legend are clearly readable and that the legend is also protected against scratching. The solder mask is preferably an epoxy liquid that is silk-screened onto the PCB.

In another preferred embodiment, the inkjet printing method of the present invention is used in a method for manufacturing a decorative etched metal panel. In this case, usually not all the metal is removed from the metal surface. The metal panel may consist of metal or can be some kind of support with a metallic surface. In the latter, all metal can be removed to reveal the color and texture of the support. Etching causes a change in optical properties of a metal surface, such as a change of gloss. After removal of the cured radiation curable inkjet ink from the metal surface an aesthetic effect is created between the etched and the non-etched metal surface. In addition to the aesthetic effect by etching, one or more differently colored radiation curable inkjet inks including a polymerizable composition having an oxygen fraction OFR≤0.250 and a weighted polymerizable functionality WPF≤0.0055 can be printed on the metal surface to produce permanent colored decorational features.

Radiation Curable Inkjet Inks

In a preferred embodiment of the present invention, a metal surface is combined with a radiation curable inkjet ink including at least 70 percent by weight of a polymerizable composition based on the total weight of radiation curable inkjet ink, wherein the polymerizable composition has an oxygen fraction OFR>0.250 and a weighted polymerizable functionality WPF≥0.0050, wherein $OFR = \sum_{i=1}^{n} \frac{15.9994 \times N_{O,i} \times \% \ wt_i}{MW_i \times \% \ wt_P}$ and $WPF = \sum_{i=1}^{n} \frac{N_{P,i} \times \% \ wt_i}{MW_i \times \% \ wt_P}$ with:

n=the number of polymerizable compounds in the polymerizable composition having a different chemical structural formula;

$N_{O,i}$=the number of oxygen atoms in polymerizable compound i;

$N_{P,i}$=the number of polymerizable groups in the polymerizable compound i;

$MW_i$=the molecular weight of the polymerizable compound i;

% $wt_i$=the weight percentage of the polymerizable compound i based on the total weight of the radiation curable inkjet ink; and % wt$_P$=the weight percentage of the polymerizable composition based on the total weight of the radiation curable inkjet ink, and wherein the polymerizable composition contains no polymerizable compound with an ethylenic double bond and including a phosphoester group or a carboxylic acid group in the molecule thereof.

The combination of the metal surface and the radiation curable inkjet according to a preferred embodiment of the present invention may be further combined with a radiation curable inkjet legend ink wherein the polymerizable composition has an oxygen fraction OFR≤0.250 and a weighted polymerizable functionality WPF≤0.0055.

The radiation curable inkjet inks may be cationically curable inkjet inks but are preferably free radical curable inkjet inks. The radiation curable inkjet inks can be cured by e-beam, but are preferably cured by light, more preferably UV light.

In a preferred embodiment the radiation curable inkjet ink is a UV curable inkjet ink, more preferably a free radical UV curable inkjet ink.

The radiation curable ink may contain a colorant. The advantage is that the printed ink pattern is clearly visible which allows orienting the metal surface during handling. The colorant may be a dye or a pigment. If the colorant is a pigment preferably a dispersant is present, more preferably a polymeric dispersant. The pigmented curable ink may contain a dispersion synergist to improve the dispersion quality and stability of the ink.

The viscosity of the radiation curable inkjet inks is preferably smaller than 20 mPa·s at 45° C. and at a shear rate of 1,000 s$^{-1}$, more preferably between 1 and 14 mPa·s at 45° C. and a shear rate of 1,000 s$^{-1}$.

For high speed, high resolution printing, the viscosity measured at 45° C. is preferably smaller than 20 mPa·s, more preferably between 1 and 14 mPa·s at 45° C. and at a shear rate of 90 s$^{-1}$. Such measurement can be performed using a Brookfield DV-II+ viscometer at 45° C. and at 12 rotations per minute.

The surface tension of the curable inkjet inks is preferably in the range of about 20 mN/m to about 70 mN/m at 25° C., more preferably in the range of about 22 mN/m to about 40 mN/m at 25° C.

The curable inkjet inks may further also contain at least one inhibitor for improving the thermal stability of the ink.

The curable inkjet inks may further also contain at least one surfactant for obtaining desired spreading characteristics on a substrate.

In a preferred embodiment, the n polymerizable compounds in the combination according to present invention all have a viscosity of less than 40 mPa·s at 25° C.

Polymerizable Compounds

Any monomer or oligomer, preferably capable of free radical polymerization, may be used as polymerizable compound. A combination of monomers, oligomers and/or prepolymers may also be used. The monomers, oligomers and/or prepolymers may possess different degrees of functionality, and a mixture including combinations of mono-, di-, tri- and higher functionality monomers, oligomers and/or prepolymers may be used. The viscosity of the radiation curable inkjet inks can be adjusted by varying the ratio between the monomers and oligomers.

Preferred monomers and oligomers are those listed in [0106] to [0115] in EP 1911814 A (AGFA GRAPHICS) incorporated herein as a specific reference.

Particularly preferred polymerizable compounds are selected from the group consisting of 1,6-hexanediol diacrylate, 1,4-butanediol diacrylate, 2-(2'-vinylethoxy)ethyl acrylate, triethyleneglycol diacrylate, triethyleneglycol dimethacrylate, propoxylated neopentylglycol diacrylate, propoxylated glycerine triacrylate, trimethylolpropane trimethylacrylate, tripropylene glycol diacrylate, diethylene glycol diacrylate, dipropylene glycol diacrylate, ethoxylated trimethylolpropane triacrylate and propoxylated trimethylolpropane triacrylate.

Photoinitiators

The photoinitiator is preferably a free radical initiator. A free radical photoinitiator is a chemical compound that initiates polymerization of monomers and oligomers when exposed to actinic radiation by the formation of a free radical.

Two types of free radical photoinitiators can be distinguished and used in the inkjet inks of preferred embodiments of the present invention. A Norrish Type I initiator is an initiator which cleaves after excitation, yielding the initiating radical immediately. A Norrish type II-initiator is a photoinitiator which is activated by actinic radiation and forms free radicals by hydrogen abstraction from a second compound that becomes the actual initiating free radical. This second compound is called a polymerization synergist or co-initiator. Both type I and type II photoinitiators can be used in preferred embodiments of the present invention, alone or in combination.

Suitable photo-initiators are disclosed in CRIVELLO, J. V., et al. VOLUME III: Photoinitiators for Free Radical Cationic. 2nd edition. Edited by BRADLEY, G. London, UK: John Wiley and Sons Ltd, 1998. p. 287-294.

Specific examples of photo-initiators may include, but are not limited to, the following compounds or combinations thereof: benzophenone and substituted benzophenones, 1-hydroxycyclohexyl phenyl ketone, thioxanthones such as isopropylthioxanthone, 2-hydroxy-2-methyl-1-phenylpropan-1-one, 2-benzyl-2-dimethylamino-(4-morpholinophenyl)butan-1-one, benzil dimethylketal, bis(2,6-dimethylbenzoyl)-2,4,4-trimethylpentylphosphine oxide, 2,4,6-trimethylbenzoyldiphenylphosphine oxide, 2-methyl-1-[4-(methylthio) phenyl]-2-morpholinopropan-1-one, 2,2-dimethoxy-1,2-diphenylethan-1-one or 5,7-diiodo-3-butoxy-6-fluorone.

Suitable commercial photo-initiators include Irgacure™ 184, Irgacure™ 500, Irgacure™ 907, Irgacure™ 369, Irgacure™ 1700, Irgacure™ 651, Irgacure™ 819, Irgacure™ 1000, Irgacure™ 1300, Irgacure™ 1870, Darocur™ 1173, Darocur™ 2959, Darocur™ 4265 and Darocur™ ITX available from CIBA SPECIALTY CHEMICALS, Lucerin™ TPO available from BASF AG, Esacure™ KT046, Esacure™ KIP150, Esacure™ KT37 and Esacure™ EDB available from LAMBERTI, H-Nu™ 470 and H-Nu™ 470X available from SPECTRA GROUP Ltd.

For safety reasons, the photoinitiator is preferably a so-called diffusion hindered photoinitiator. A diffusion hindered photoinitiator is a photoinitiator which exhibits a much lower mobility in a cured layer of the curable inkjet ink than a monofunctional photoinitiator, such as benzophenone. Several methods can be used to lower the mobility of the photoinitiator. One way is to increase the molecular weight of the photoinitiator so that the diffusion speed is reduced, e.g. polymeric photoinitiators. Another way is to increase its reactivity so that it is built into the polymerizing network, e.g. multifunctional photoinitiators (having 2, 3 or more photoinitiating groups) and polymerizable photoinitiators. The diffusion hindered photoinitiator is preferably selected from the group consisting of non-polymeric multifunctional photoinitiators, oligomeric or polymeric photoinitiators and polymerizable photoinitiators. Non-polymeric di- or multifunctional photoinitiators are considered to have a molecular weight between 300 and 900 Dalton. Non-polymerizable monofunctional photoinitiators with a molecular weight in that range are not diffusion hindered photoinitiators. Most preferably the diffusion hindered photoinitiator is a polymerizable initiator.

Suitable diffusion hindered photoinitiators are also those disclosed in EP 2053101 A (AGFA) in paragraphs [0074] and [0075] for difunctional and multifunctional photoinitiators, in paragraphs [0077] to [0080] for polymeric photoinitiators and in paragraphs [0081] to [0083] for polymerizable photoinitiators.

Other preferred polymerizable photoinitiators are those disclosed in EP 2065362 A (AGFA) and EP 2161264 A (AGFA), incorporated herein by reference.

A preferred amount of photoinitiator is 0-50 wt %, more preferably 0.1-20 wt %, and most preferably 0.3-15 wt % of the total weight of the curable inkjet ink.

Co-Initiators

In order to increase the photosensitivity further, the radiation curable inkjet ink may additionally contain co-initiators. Suitable examples of co-initiators can be categorized in three groups:
(1) tertiary aliphatic amines such as methyldiethanolamine, dimethylethanolamine, triethanolamine, triethylamine and N-methylmorpholine;
(2) aromatic amines such as amylparadimethylaminobenzoate, 2-n-butoxyethyl-4-(dimethylamino)benzoate, 2-(dimethylamino)ethylbenzoate, ethyl-4-(dimethylamino)benzoate, and 2-ethylhexyl-4-(dimethylamino)benzoate; and
(3) (meth)acrylated amines such as dialkylamino alkyl (meth)acrylates (e.g., diethylaminoethylacrylate) or N-morpholinoalkyl-(meth)acrylates (e.g., N-morpholinoethylacrylate).

The preferred co-initiators are aminobenzoates.

The one or more co-initiators included into the radiation curable inkjet ink are preferably diffusion hindered co-initiators for safety reasons. A diffusion hindered co-initiator is preferably selected from the group consisting of non-polymeric di- or multifunctional co-initiators, oligomeric or polymeric co-initiators and polymerizable co-initiators. More preferably the diffusion hindered co-initiator is selected from the group consisting of polymeric co-initiators and polymerizable co-initiators.

The radiation curable inkjet ink preferably comprises a co-initiator in an amount of 0.1 to 50 wt %, more preferably in an amount of 0.5 to 25 wt %, most preferably in an amount of 1 to 10 wt % of the total weight of the radiation curable inkjet ink.

Inhibitors

The radiation curable inkjet ink may further also contain at least one inhibitor for improving the thermal stability of the ink.

Suitable polymerization inhibitors include phenol type antioxidants, hindered amine light stabilizers, phosphor type antioxidants, hydroquinone monomethyl ether commonly used in (meth)acrylate monomers, and hydroquinone, t-butylcatechol, pyrogallol, 2,6-di-tert.butyl-4-methylphenol (=BHT) may also be used.

Suitable commercial inhibitors are, for example, Sumilizer™ GA-80, Sumilizer™ GM and Sumilizer™ GS produced by Sumitomo Chemical Co. Ltd.; Genorad™ 16, Genorad™18 and Genorad™ 20 from Rahn AG; Irgastab™ UV10 and Irgastab™ UV22, Tinuvin™ 460 and CGS20 from Ciba Specialty Chemicals; Floorstab™ UV range (UV-1, UV-2, UV-5 and UV-8) from Kromachem Ltd, Additol™ S range (S100, S110, S120 and S5130) from Cytec Surface Specialties.

The inhibitor is preferably a polymerizable inhibitor.

Since excessive addition of these polymerization inhibitors may lower the curing speed, it is preferred that the amount capable of preventing polymerization is determined prior to blending. The amount of a polymerization inhibitor is preferably lower than 5 wt %, more preferably lower than 3 wt % of the total radiation curable inkjet ink.

Colorants

Colorants used in the radiation curable inkjet inks may be dyes, pigments or a combination thereof. Organic and/or inorganic pigments may be used. The colorant is preferably a pigment or a polymeric dye, most preferably a pigment.

The pigments may be black, white, cyan, magenta, yellow, red, orange, violet, blue, green, brown, mixtures thereof, and the like. A colour pigment may be chosen from those disclosed by HERBST, Willy, et al. Industrial Organic Pigments, Production, Properties, Applications. 3rd edition. Wiley-VCH, 2004. ISBN 3527305769.

Suitable pigments are disclosed in paragraphs [0128] to [0138] of WO 2008/074548 (AGFA GRAPHICS).

Pigment particles in inkjet inks should be sufficiently small to permit free flow of the ink through the inkjet-printing device, especially at the ejecting nozzles. It is also desirable to use small particles for maximum colour strength and to slow down sedimentation.

The numeric average pigment particle size is preferably between 0.050 and 1 µm, more preferably between 0.070 and 0.300 µm and particularly preferably between 0.080 and 0.200 µm. Most preferably, the numeric average pigment particle size is no larger than 0.150 µm. The average particle size of pigment particles is determined with a Brookhaven Instruments Particle Sizer BI90plus based upon the principle of dynamic light scattering. The ink is diluted with ethyl acetate to a pigment concentration of 0.002 wt %. The measurement settings of the BI90plus are: 5 runs at 23° C., angle of 90°, wavelength of 635 nm and graphics=correction function.

However for white pigment inkjet inks, the numeric average particle diameter of the white pigment is preferably from 50 to 500 nm, more preferably from 150 to 400 nm, and most preferably from 200 to 350 nm. Sufficient hiding power cannot be obtained when the average diameter is less than 50 nm, and the storage ability and the jet-out suitability of the ink tend to be degraded when the average diameter exceeds 500 nm. The determination of the numeric average particle diameter is best performed by photon correlation spectroscopy at a wavelength of 633 nm with a 4 mW HeNe laser on a diluted sample of the pigmented inkjet ink. A suitable particle size analyzer used was a Malvern™ nano-S available from Goffin-Meyvis. A sample can, for example, be prepared by addition of one drop of ink to a cuvette containing 1.5 mL ethyl acetate and mixed until a homogenous sample was obtained. The measured particle size is the average value of 3 consecutive measurements consisting of 6 runs of 20 seconds.

Suitable white pigments are given by Table 2 in [0116] of WO 2008/074548 (AGFA GRAPHICS). The white pigment is preferably a pigment with a refractive index greater than 1.60. The white pigments may be employed singly or in combination. Preferably titanium dioxide is used as pigment with a refractive index greater than 1.60. Suitable titanium dioxide pigments are those disclosed in [0117] and in [0118] of WO 2008/074548 (AGFA GRAPHICS).

The pigments are preferably present in the range of 0.01 to 15%, more preferably in the range of 0.05 to 10% by weight and most preferably in the range of 0.1 to 5% by weight, each based on the total weight of the inkjet ink. For white inkjet inks, the white pigment is preferably present in an amount of 3% to 40% by weight of the inkjet ink, and more preferably 5% to 35%. An amount of less than 3% by weight cannot achieve sufficient covering power and usually exhibits very poor storage stability and ejection property.

Generally dyes exhibit a higher light fading than pigments, but cause no problems on jettability. It was found that anthraquinone dyes exhibit only minor light fading under the normal UV curing conditions used in UV curable inkjet printing. In a preferred embodiment, the colorant in the radiation curable inkjet ink is an anthraquinone dye, such as Macrolex™ Blue 3R (CASRN 325781-98-4) from LANXESS.

Dispersants

The dispersant is preferably a polymeric dispersant. Typical polymeric dispersants are copolymers of two monomers but may contain three, four, five or even more monomers. The properties of polymeric dispersants depend on both the nature of the monomers and their distribution in the polymer. Suitable copolymeric dispersants have the following polymer compositions:

statistically polymerized monomers (e.g. monomers A and B polymerized into ABBAABAB);

alternating polymerized monomers (e.g. monomers A and B polymerized into ABABABAB);

gradient (tapered) polymerized monomers (e.g. monomers A and B polymerized into AAABAABBABBB);

block copolymers (e.g. monomers A and B polymerized into AAAAABBBBBB) wherein the block length of each of the blocks (2, 3, 4, 5 or even more) is important for the dispersion capability of the polymeric dispersant;

graft copolymers (graft copolymers consist of a polymeric backbone with polymeric side chains attached to the backbone); and mixed forms of these polymers, e.g. blocky gradient copolymers.

Suitable polymeric dispersants are listed in the section on "Dispersants", more specifically [0064] to [0070] and [0074] to [0077], in EP 1911814 A (AGFA GRAPHICS).

The polymeric dispersant has preferably a number average molecular weight Mn between 500 and 30000, more preferably between 1500 and 10000.

The polymeric dispersant has preferably a weight average molecular weight Mw smaller than 100000, more preferably smaller than 50000 and most preferably smaller than 30000.

The polymeric dispersant has preferably a polydispersity PD smaller than 2, more preferably smaller than 1.75 and most preferably smaller than 1.5.

Commercial examples of polymeric dispersants are the following:

DISPERBYK™ dispersants available from BYK CHEMIE GMBH;
SOLSPERSE™ dispersants available from NOVEON;
TEGO™ DISPERS™ dispersants from EVONIK;
EDAPLAN™ dispersants from MUNZING CHEMIE;
ETHACRYL™ dispersants from LYONDELL;
GANEX™ dispersants from ISP;
DISPEX™ and EFKA™ dispersants from CIBA SPECIALTY CHEMICALS INC (BASF);
DISPONER™ dispersants from DEUCHEM; and
JONCRYL™ dispersants from JOHNSON POLYMER.

Particularly preferred polymeric dispersants include Solsperse™ dispersants from NOVEON, Efka™ dispersants from CIBA SPECIALTY CHEMICALS INC (BASF) and Disperbyk™ dispersants from BYK CHEMIE GMBH. Particularly preferred dispersants are Solsperse™ 32000, 35000 and 39000 dispersants from NOVEON.

The polymeric dispersant is preferably used in an amount of 2 to 600 wt %, more preferably 5 to 200 wt % based on the weight of the pigment.

Dispersion Synergists

A dispersion synergist usually consists of an anionic part and a cationic part. The anionic part of the dispersion synergist usually exhibits a certain molecular similarity with the colour pigment and the cationic part of the dispersion synergist consists of one or more protons and/or cations to compensate the charge of the anionic part of the dispersion synergist.

The synergist is preferably added in a smaller amount than the polymeric dispersant(s). The ratio of polymeric dispersant/dispersion synergist depends upon the pigment and should be determined experimentally.

Preferably the ratio wt % polymeric dispersant/wt % dispersion synergist is selected between 2:1 to 100:1, preferably between 2:1 and 20:1.

Suitable dispersion synergists that are commercially available include Solsperse™ 5000 and Solsperse™ 22000 from NOVEON.

Suitable dispersion synergists include those disclosed in EP 1790698 A (AGFA GRAPHICS), EP 1790696 A (AGFA GRAPHICS), WO 2007/060255 (AGFA GRAPHICS) and EP 1790695 A (AGFA GRAPHICS)

In dispersing C.I. Pigment Blue 15:3, the use of a sulfonated Cu-phthalocyanine dispersion synergist, e.g. Solsperse™ 5000 from NOVEON is preferred. Suitable dispersion synergists for yellow inkjet inks include those disclosed in EP 1790697 A (AGFA GRAPHICS).

In a preferred embodiment, the dispersion synergist includes one, two or more carboxylic acid groups and preferably no sulfonic acid groups.

Surfactants

The radiation curable inkjet ink may further also contain a surfactant for obtaining good spreading characteristics on a substrate. The surfactant(s) can be anionic, cationic, non-ionic, or zwitterionic and are usually added in a total quantity less than 10 wt % based on the total weight of the radiation curable liquid or ink and particularly in a total less than 5 wt % based on the total weight of the radiation curable liquid or ink.

Preferred surfactants include fluoro surfactants (such as fluorinated hydrocarbons) and silicone surfactants. The silicones are typically siloxanes and can be polyether modified, polyester modified, polyether modified hydroxy functional, amine modified, epoxy modified and other modifications or combinations thereof. Silicone surfactants, especially the reactive silicone surfactants, are preferred in radiation curable inkjet inks.

In a preferred embodiment, the radiation curable inkjet ink contains no surfactant.

Inkjet Printing Devices

In the inkjet printing method according to a preferred embodiment of the present invention, the radiation curable inkjet inks may be jetted by one or more print heads ejecting small droplets in a controlled manner through nozzles onto a substrate, which is moving relative to the print head(s).

A preferred print head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the print head creating a void, which is then filled with ink.

When the voltage is again removed, the ceramic expands to its original shape, ejecting a drop of ink from the print head. However the inkjet printing method according to preferred embodiments of the present invention is not restricted to piezoelectric inkjet printing. Other inkjet print heads can be used and include various types, such as a continuous type.

The inkjet print head normally scans back and forth in a transversal direction across the moving ink-receiving metal surface. Often the inkjet print head does not print on the way back. Bi-directional printing is preferred for obtaining a high areal throughput. Another preferred printing method is by a "single pass printing process", which can be performed by using page wide inkjet print heads or multiple staggered inkjet print heads which cover the entire width of the ink-receiving metal surface. In a single pass printing process the inkjet print heads usually remain stationary and the metal surface is transported under the inkjet print heads.

Curing Devices

In the inkjet printing method according to a preferred embodiment of the present invention, the radiation curable inkjet inks are cured by exposing them to actinic radiation, preferably by ultraviolet radiation.

The curing device may be arranged in combination with the print head of the inkjet printer, travelling therewith so that the curable inkjet ink is exposed to curing radiation very shortly after been jetted.

In such an arrangement it can be difficult to provide a small enough radiation source connected to and travelling with the print head, such as LED. Alternatively, the actinic radiation may be supplied from a fixed source to the radiation head by an arrangement of mirrors including a mirror upon the radiation head.

The source of radiation arranged not to move with the print head, may also be an elongated radiation source extending transversely across the ink-receiver surface to be cured and adjacent the transverse path of the print head so that the subsequent rows of images formed by the print head are passed, stepwise or continually, beneath that radiation source.

Any ultraviolet light source, as long as part of the emitted light can be absorbed by the photo-initiator or photo-initiator system, may be employed as a radiation source, such as, a high or low pressure mercury lamp, a cold cathode tube, a black light, an ultraviolet LED, an ultraviolet laser, and a flash light. Of these, the preferred source is one exhibiting a relatively long wavelength UV-contribution having a dominant wavelength of 300-400 nm. Specifically, a UV-A light source is preferred due to the reduced light scattering therewith resulting in more efficient interior curing.

UV radiation is generally classed as UV-A, UV-B, and UV-C as follows:
UV-A: 400 nm to 320 nm
UV-B: 320 nm to 290 nm
UV-C: 290 nm to 100 nm.

In a preferred embodiment of the method of inkjet printing according to the present invention, the inkjet printing device contains one or more UV LEDs with a wavelength larger than 360 nm, preferably one or more UV LEDs with a wavelength larger than 380 nm, and most preferably UV LEDs with a wavelength of about 395 nm.

Furthermore, it is possible to cure the image using, consecutively or simultaneously, two light sources of differing wavelength or illuminance. For example, the first UV-source can be selected to be rich in UV-C, in particular in the range of 260 nm-200 nm. The second UV-source can then be rich in UV-A, e.g. a gallium-doped lamp, or a different lamp high in both UV-A and UV-B. The use of two UV-sources has been found to have advantages e.g. a fast curing speed and a high curing degree.

For facilitating curing, the inkjet printer may include one or more oxygen depletion units. The oxygen depletion units place a blanket of nitrogen or other relatively inert gas (e.g. $CO_2$), with adjustable position and adjustable inert gas concentration, in order to reduce the oxygen concentration in the curing environment. Residual oxygen levels are usually maintained as low as 200 ppm, but are generally in the range of 200 ppm to 1200 ppm.

EXAMPLES

Materials

All materials used in the following examples were readily available from standard sources such as ALDRICH CHEMICAL Co. (Belgium) and ACROS (Belgium) unless otherwise specified. The water used was deionized water.

ITX is Darocur™ ITX is an isomeric mixture of 2- and 4-isopropylthioxanthone from CIBA SPECIALTY CHEMICALS.

Irgacure™ 907 is 2-methyl-1-[4-(methylthio)phenyl]-2-morpholino-propan-1-one, a photoinitiator available from CIBA SPECIALTY CHEMICALS.

Irgacure™ 819 is bis(2,4,6-trimethylbenzoyl)-phenyl-phosphineoxide, a photoinitiator available from CIBA SPECIALTY CHEMICALS.

Darocur™ TPO is 2,4,6-trimethylbenzoyl-diphenyl-phosphineoxide, a photoinitiator available from CIBA SPECIALTY CHEMICALS.

MBF is an aromatic photoinitiator (CAS 15206-55-0) available as Speedcure™ MBF from LAMBSON.

Inhib-1 is a mixture forming a polymerization inhibitor having a composition:

| Component | wt % |
|---|---|
| DPGDA | 82.4 |
| p-methoxyphenol | 4.0 |
| 2,6-di-tert-butyl-4-methylphenol | 10.0 |
| Cupferron ™ AL | 3.6 |

Cupferron™ AL is aluminum N-nitrosophenylhydroxylamine from WAKO CHEMICALS LTD.

Macrolex™ Blue 3R is a blue anthraquinone dye from LANXESS.

Isola™ 400 is a Cu-plate available from CCI Eurolam having a metal surface consisting of a 18μ Cu-laminate.

The monomers are listed here below with their abbreviation as used in the Examples.

Sartomer grades are available from SARTOMER.
Miramer grades are available from MIWON Europe GmbH.
Laromer grades are available from BASF.
VEEA is available from NIPPON SHOKUBAI, Japan.
Cardura™ ACE is available from HEXION SPECIALTY CHEMICALS.
ACMO is available from RAHN AG.
MAES is available from ALDRICH.
MADAME is available from ARKEMA France.

| Monomer | Commercial name | Chemical name |
|---|---|---|
| ACE | Cardura ™ ACE | Glycerine t.decanoate acrylate |
| DCPA | Laromer ™ DCPA | Dicyclopentadienyl acrylate |

-continued

| Monomer | Commercial name | Chemical name |
|---|---|---|
| TBCH | Laromer™ TBCH | 4-t.Butylcyclohexyl acrylate |
| M140 | Miramer™ M140 | 2-Phenoxyethyl acrylate |
| M202 | Miramer™ M202 | 1,6-Hexanediol (3x ethoxylated) diacrylate |
| M280 | Miramer™ M280 | Polyethylene glycol (MW400) diacrylate |
| M282 | Miramer™ M282 | Polyethylene glycol (MW200) diacrylate |
| M286 | Miramer™ M286 | Polyethylene glycol (MW600) diacrylate |
| M3130 | Miramer™ M3130 | Trimethylolpropane (3x ethoxylated) triacrylate |
| CD420 | Sartomer™ CD420 | 3,3,5-Trimethylcyclohexyl acrylate |
| CD561 | Sartomer™ CD561 | 1,6-Hexanediol (5.6x ethoxylated) diacrylate |
| CD9021 | Sartomer™ CD9021 | Glycerine (5.5x propoxylated) triacrylate |
| SR205 | Sartomer™ SR205 | Triethylene glycol dimethacrylate |
| SR206 | Sartomer™ SR206 | Ethylene glycol dimethacrylate |
| SR209 | Sartomer™ SR209 | Tetraethylene glycol dimethacrylate |
| SR210 | Sartomer™ SR210 | Polyethylene glycol (MW200) dimethacrylate |
| SR213 | Sartomer™ SR213 | 1,4-Butanediol diacrylate |
| SR230 | Sartomer™ SR230 | Diethylene glycol diacrylate |
| SR238 | Sartomer™ SR238 | 1,6-Hexanediol diacrylate |
| SR239 | Sartomer™ SR239 | 1,6-Hexanediol dimethacrylate |
| SR252 | Sartomer™ SR252 | Polyethylene glycol (MW600) dimethacrylate |
| SR259 | Sartomer™ SR259 | Polyethylene glycol (MW200) diacrylate |
| SR272 | Sartomer™ SR272 | Triethylene glycol diacrylate |
| SR339 | Sartomer™ SR339 | 2-Phenoxyethyl acrylate |
| SR344 | Sartomer™ SR344 | Polyethylene glycol (MW400) diacrylate |
| SR350 | Sartomer™ SR350 | Trimethylolpropane trimethacrylate |
| SR351 | Sartomer™ SR351 | Trimethylolpropane triacrylate |
| SR454 | Sartomer™ SR454 | Trimethylolpropane (3x ethoxylated) triacrylate |
| SR492 | Sartomer™ SR492 | Trimethylolpropane (3x propoxylated) triacrylate |
| SR499 | Sartomer™ SR499 | Trimethylolpropane (6x ethoxylated) triacrylate |
| SR506D | Sartomer™ SR506D | Isobornyl acrylate |
| SR508 | Sartomer™ SR508 | Dipropylene glycol diacrylate |
| SR610 | Sartomer™ SR610 | Polyethylene glycol (MW600) diacrylate |
| SR9003 | Sartomer™ SR9003 | Neopentylglycol (2x propoxylated) diacrylate |
| SR9020HP | Sartomer™ SR9020HP | Glycerine (3x propoxylated) triacrylate |
| SR9035 | Sartomer™ SR9035 | Trimethylolpropane (15x ethoxylated) triacrylate |
| SR9054 | Sartomer™ SR9054 | 2-hydroxyethyl methacrylate phosphate |
| MAES | none | Mono-2-(methacryloyloxy)ethyl succinate |
| ACMO | none | N-Acryloyl morpholine |
| MADAME | Norsocryl™ MADAME | N,N-dimethyl 2-aminoethyl methacrylate |
| VEEA | none | 2-(2'-Vinyloxyethoxy)ethyl acrylate |

Measurements

1. Etch Resistance

The etch resistance was evaluated by the determining the percentage of the cured inkjet ink layer that remained on the copper plate after etching. An etch resistance of 100% means that the whole cured inkjet ink layer survived the etching bath. An etch resistance of 0% means that no cured inkjet ink could be found to be present on the copper plate after etching. An intermediate percentage, e.g. 80% means that about 80% of the cured inkjet ink could be found to be present on the copper plate after etching. A good etch resistance means a value of at least 80%. Excellent etch resistance means a value of at least 90% but preferably 100%.

2. Strippability

The strippability was evaluated by the determining the percentage of the cured inkjet ink layer that was removed from the copper plate after stripping. A strippability of 100% means that the whole cured inkjet ink layer was removed. A strippability of 0% means that no cured inkjet ink could be removed from the copper plate. An intermediate percentage, e.g. 30% means that only about 30% of the cured inkjet ink could be removed from the copper plate by stripping. A good strippability means a value of at least 80%. Excellent strippability means a value of at least 90% but preferably 100%. A value of 30% or less is a very poor strippability.

3. Viscosity

The viscosity of the formulations was measured at 45° C. using a "Robotic Viscometer Type VISCObot" from CAMBRIDGE APPLIED SYSTEMS.

For industrial inkjet printing, the viscosity is preferably less than 20 mPa·s at 45° C. More preferably the viscosity is less than 15 mPa·s at 45° C.

4. Curing Speed

A radiation curable inkjet ink was coated on a PET100 substrate using a bar coater and a 10 μm wired bar. The coated sample was cured using a Fusion DRSE-120 conveyer, equipped with a Fusion VPS/I600 lamp (D-bulb), which transported the samples under the UV-lamp on a conveyer belt at a speed of 20 m/min. The maximum output of the lamp was 1.05 J/cm$^2$ and a peak intensity of 5.6 W/cm$^2$. The percentage of the maximum output of the lamp was taken as a measure for curing speed, the lower the number the higher the curing speed. A sample was considered as fully cured at the moment scratching with a Q-tip caused no visual damage.

Example 1

This example illustrates an inkjet printing method for an etching process using a radiation curable inkjet ink including a single polymerizable compound.

Preparation of the Radiation Curable Inkjet Inks

The radiation curable inkjet inks COMP-1 to COMP-18 and INV-1 to INV-24 were prepared by mixing the components according to the weight percentages based on the total weight of the ink listed in Table 1 and using the polymerizable compound of Table 2.

TABLE 1

| Component | wt % |
|---|---|
| ITX | 5.00 |
| Irgacure™ 907 | 5.00 |
| Irgacure™ 819 | 3.00 |
| Darocur™ TPO | 2.00 |
| Inhib-1 | 1.00 |
| Macrolex™ Blue 3R | 1.75 |
| Polymerizable compound | 82.25 |

Isola™ 400 copper plates were cleaned for 5 seconds at 25° C. with a solution called Mecbrite™ CA-95 from MEC Europe, which has pH<1 and contained $H_2SO_4$, $H_2O_2$ and $Cu^{2+}$. During this operation a thin top layer of Cu (0.3-0.5 μm) was removed. The plates were then rinsed with a water jet for 90 seconds.

A pattern of the radiation curable inkjet inks COMP-1 to COMP-18 and INV-1 to INV-24 was coated at a thickness of 10 μm on the copper plate and cured by a Fusion DRSE-120 conveyer, equipped with a Fusion VPS/1600 lamp (D-bulb), which transported the samples under the UV-lamp on a conveyer belt at a speed of 20 m/min. The maximum output of the lamp was 1.05 J/cm$^2$ and a peak intensity of 5.6 W/cm$^2$. All inkjet inks were fully cured.

The plates were subjected to an acidic etch bath ("Mega" acid etchant obtained from Mega Electronics, pH 2, contains FeCl$_3$) for 60 seconds at 35° C. The plates were subsequently rinsed for 90 seconds with water and dried. An evaluation of the etch resistance was then made as shown in Table 2.

The copper plates having their inkjet ink layer removed during etching could naturally not be evaluated for strippability (in Table 2 marked with nab.). The other copper plates were subjected for 5 minutes at 50° C. to an alkaline strip bath (containing 10% Ristoff C-71 from Centurion Specialty Chemicals Ltd which includes 7% ethanolamine, pH 13), then rinsed for 90 seconds with water, dried, and evaluated for strippability. The results are shown in Table 2.

TABLE 2

| Inkjet ink | Polymerizable compound | OFR | WPF | Etch Resistance | Strippability |
|---|---|---|---|---|---|
| COMP-1 | CD420 | 0.163 | 0.0051 | 100% | 0% |
| COMP-2 | M284 | 0.369 | 0.0049 | 0% | n.a. |
| COMP-3 | DCPA | 0.157 | 0.0049 | 100% | 0% |
| COMP-4 | ACE | 0.266 | 0.0033 | 100% | 0% |
| COMP-5 | TBCH | 0.152 | 0.0048 | 100% | 0% |
| COMP-6 | SR506D | 0.154 | 0.0048 | 100% | 0% |
| COMP-7 | SR339 | 0.250 | 0.0052 | 100% | 0% |
| COMP-8 | M140 | 0.250 | 0.0052 | 100% | 0% |
| COMP-9 | MADAME | 0.204 | 0.0064 | 0% | n.a. |
| COMP-10 | SR495 | 0.325 | 0.0029 | 0% | n.a. |
| COMP-11 | ACMO | 0.227 | 0.0071 | 0% | n.a. |
| COMP-12 | SR252 | 0.352 | 0.0027 | 0% | n.a. |
| COMP-13 | CD561 | 0.325 | 0.0042 | 0% | n.a. |
| COMP-14 | SR9035 | 0.351 | 0.0031 | 0% | n.a. |
| COMP-15 | SR610 | 0.366 | 0.0028 | 0% | n.a. |
| COMP-16 | M286 | 0.366 | 0.0028 | 0% | n.a. |
| COMP-17 | M280 | 0.368 | 0.0039 | 0% | n.a. |
| COMP-18 | SR344 | 0.368 | 0.0039 | 0% | n.a. |
| INV-1 | VEEA | 0.344 | 0.0054 | 100% | 100% |
| INV-2 | SR499 | 0.342 | 0.0054 | 100% | 100% |
| INV-3 | SR259 | 0.370 | 0.0065 | 100% | 100% |
| INV-4 | M282 | 0.370 | 0.0065 | 100% | 100% |
| INV-5 | M202 | 0.312 | 0.0056 | 100% | 100% |
| INV-6 | SR210 | 0.339 | 0.0059 | 100% | 100% |
| INV-7 | SR209 | 0.339 | 0.0061 | 100% | 100% |
| INV-8 | SR205 | 0.335 | 0.0070 | 100% | 100% |
| INV-9 | SR272 | 0.372 | 0.0077 | 100% | 100% |
| INV-10 | CD9021 | 0.321 | 0.0052 | 100% | 100% |
| INV-11 | SR350 | 0.284 | 0.0089 | 100% | 100% |
| INV-12 | SR508 | 0.330 | 0.0083 | 100% | 100% |
| INV-13 | SR9003 | 0.292 | 0.0061 | 100% | 100% |
| INV-14 | SR213 | 0.323 | 0.0101 | 100% | 100% |
| INV-15 | SR351 | 0.324 | 0.0101 | 100% | 100% |
| INV-16 | M220 | 0.320 | 0.0067 | 100% | 100% |
| INV-17 | SR230 | 0.373 | 0.0093 | 100% | 100% |
| INV-18 | SR239 | 0.252 | 0.0079 | 100% | 100% |
| INV-19 | SR9020HP | 0.336 | 0.0070 | 100% | 100% |
| INV-20 | SR206 | 0.323 | 0.0101 | 100% | 100% |
| INV-21 | SR492 | 0.306 | 0.0064 | 100% | 100% |
| INV-22 | SR238 | 0.283 | 0.0088 | 100% | 100% |
| INV-23 | SR454 | 0.336 | 0.0070 | 100% | 100% |
| INV-24 | M3130 | 0.336 | 0.0070 | 100% | 100% |

Evaluation

From Table 2, it should be clear that only the radiation curable inkjet inks wherein the polymerizable composition has an oxygen fraction OFR>0.250 and a weighted polymerizable functionality WPF≥0.0050 resulted in excellent etch resistance and strippability.

Example 2

This example illustrates an inkjet printing method for an etching process using a radiation curable inkjet ink including a mixture of two polymerizable compounds.

Preparation of the Radiation Curable Inkjet Inks

The radiation curable inkjet inks COMP-19 to COMP-30 and INV-25 to INV-54 were prepared by mixing the components according to Table 3 and using the polymerizable compounds P1 and P2 in the weight percentages based on the total weight of ink as indicated in Table 4.

TABLE 3

| Component | wt % |
|---|---|
| ITX | 5.00 |
| Irgacure ™ 907 | 5.00 |
| Irgacure ™ 819 | 3.00 |
| Darocure ™ TPO | 2.00 |
| Inhib-1 | 1.00 |
| Macrolex ™ Blue 3R | 1.75 |
| Polymerizable compound P1 | together 82.25 |
| Polymerizable compound P2 | |

Isola™ 400 copper plates were cleaned in the same manner as in EXAMPLE 1. A pattern of the radiation curable inkjet inks COMP-19 to COMP-30 and INV-25 to INV-54 was coated at a thickness of 10 μm and cured on the cleaned copper plate in the same manner as in EXAMPLE 1. The plates were then etched and stripped in the same manner as in EXAMPLE 1. The results are shown in Table 4.

TABLE 4

| Inkjet Ink | Mixture P1/P2 | wt % P1 | wt % P2 | OFR | WPF | Etch Resistance | Strippability |
|---|---|---|---|---|---|---|---|
| COMP-19 | SR508/CD561 | 2.25 | 80.00 | 0.325 | 0.0043 | 0% | n.a. |
| COMP-20 | SR238/CD561 | 2.25 | 80.00 | 0.324 | 0.0043 | 60% | 100% |
| COMP-21 | SR610/CD561 | 2.25 | 80.00 | 0.326 | 0.0042 | 0% | n.a. |
| COMP-22 | SR610/CD561 | 22.25 | 60.00 | 0.336 | 0.0038 | 0% | n.a. |
| COMP-23 | SR610/CD561 | 42.25 | 40.00 | 0.346 | 0.0035 | 0% | n.a. |
| COMP-24 | SR610/CD561 | 62.25 | 20.00 | 0.356 | 0.0032 | 0% | n.a. |
| COMP-25 | SR610/SR506D | 10.00 | 72.25 | 0.179 | 0.0046 | 100% | 10% |
| COMP-26 | SR610/SR506D | 20.00 | 62.25 | 0.205 | 0.0043 | 100% | 20% |
| COMP-27 | SR610/SR506D | 50.00 | 32.25 | 0.283 | 0.0036 | 30% | 100% |
| COMP-28 | SR610/SR506D | 70.00 | 12.25 | 0.335 | 0.0031 | 0% | n.a. |

TABLE 4-continued

| Inkjet Ink | Mixture P1/P2 | wt % P1 | wt % P2 | OFR | WPF | Etch Resistance | Strippability |
|---|---|---|---|---|---|---|---|
| COMP-29 | SR610/SR238 | 60.00 | 22.25 | 0.344 | 0.0045 | 0% | n.a. |
| COMP-30 | SR610/SR238 | 70.00 | 12.25 | 0.354 | 0.0037 | 0% | n.a. |
| INV-25 | SR508/CD561 | 12.25 | 70.00 | 0.326 | 0.0048 | 95% | 100% |
| INV-26 | SR508/CD561 | 22.25 | 60.00 | 0.326 | 0.0053 | 100% | 100% |
| INV-27 | SR508/CD561 | 32.25 | 50.00 | 0.327 | 0.0058 | 100% | 100% |
| INV-28 | SR508/CD561 | 42.25 | 40.00 | 0.328 | 0.0063 | 100% | 100% |
| INV-29 | SR508/CD561 | 52.25 | 30.00 | 0.328 | 0.0068 | 100% | 100% |
| INV-30 | SR508/CD561 | 62.25 | 20.00 | 0.329 | 0.0073 | 100% | 100% |
| INV-31 | SR508/CD561 | 72.25 | 10.00 | 0.330 | 0.0078 | 100% | 90% |
| INV-32 | SR238/CD561 | 12.25 | 70.00 | 0.319 | 0.0049 | 95% | 100% |
| INV-33 | SR238/CD561 | 22.25 | 60.00 | 0.313 | 0.0055 | 100% | 100% |
| INV-34 | SR238/CD561 | 32.25 | 50.00 | 0.308 | 0.0060 | 100% | 100% |
| INV-35 | SR238/CD561 | 42.25 | 40.00 | 0.303 | 0.0066 | 100% | 100% |
| INV-36 | SR238/CD561 | 52.25 | 30.00 | 0.298 | 0.0072 | 100% | 100% |
| INV-37 | SR238/CD561 | 62.25 | 20.00 | 0.293 | 0.0077 | 100% | 90% |
| INV-38 | SR238/CD561 | 72.25 | 10.00 | 0.288 | 0.0083 | 100% | 90% |
| INV-39 | SR259/SR238 | 10.00 | 72.25 | 0.293 | 0.0086 | 100% | 100% |
| INV-40 | SR259/SR238 | 20.00 | 62.25 | 0.304 | 0.0083 | 100% | 100% |
| INV-41 | SR259/SR238 | 30.00 | 52.25 | 0.315 | 0.0080 | 100% | 80% |
| INV-42 | SR259/SR238 | 40.00 | 42.25 | 0.325 | 0.0077 | 100% | 100% |
| INV-43 | SR259/SR238 | 50.00 | 32.25 | 0.336 | 0.0074 | 100% | 100% |
| INV-44 | SR259/SR238 | 52.25 | 30.00 | 0.338 | 0.0073 | 100% | 100% |
| INV-45 | SR259/SR238 | 52.25 | 30.00 | 0.338 | 0.0073 | 100% | 100% |
| INV-46 | SR259/SR238 | 60.00 | 22.25 | 0.347 | 0.0071 | 100% | 100% |
| INV-47 | SR259/SR238 | 70.00 | 12.25 | 0.357 | 0.0068 | 100% | 100% |
| INV-48 | SR259/SR506D | 40.00 | 42.25 | 0.259 | 0.0056 | 100% | 100% |
| INV-49 | SR259/SR506D | 50.00 | 32.25 | 0.285 | 0.0058 | 100% | 100% |
| INV-50 | SR259/SR506D | 60.00 | 22.25 | 0.312 | 0.0060 | 100% | 100% |
| INV-51 | SR259/SR506D | 70.00 | 12.25 | 0.338 | 0.0062 | 100% | 100% |
| INV-52 | SR610/SR238 | 10.00 | 72.25 | 0.293 | 0.0081 | 100% | 100% |
| INV-53 | SR610/SR238 | 20.00 | 62.25 | 0.303 | 0.0074 | 100% | 100% |
| INV-54 | SR610/SR238 | 30.00 | 52.25 | 0.313 | 0.0066 | 100% | 100% |

Evaluation

From Table 4, it should be clear that only the radiation curable inkjet inks wherein the polymerizable composition has an oxygen fraction OFR>0.250 and a weighted polymerizable functionality WPF≥0.0050 resulted in good to excellent etch resistance and strippability.

Example 3

This example illustrates the applicability of radiation curable inkjet inks to a wide range of etch process conditions.

Preparation of the Radiation Curable Inkjet Inks

The radiation curable inkjet inks COMP-31 to COMP-42 and INV-55 to INV-77 were prepared by mixing the components according to Table 5 and using the polymerizable compounds P1 (and P2 if present) in the weight percentages based on the total weight of ink as indicated in Table 6.

TABLE 5

| Component | wt % |
|---|---|
| ITX | 5.00 |
| Irgacure ™ 907 | 5.00 |
| Irgacure ™ 819 | 3.00 |
| Darocure ™ TPO | 2.00 |
| Inhib-1 | 1.00 |
| Macrolex ™ Blue 3R | 1.75 |
| Polymerizable compound P1 | together 82.25 |
| Polymerizable compound P2 (if present) | |

TABLE 6

| Inkjet Ink | Polymerizable compound(s) P1 (/P2) | wt % of P1 | wt % of P2 | OFR | WPF |
|---|---|---|---|---|---|
| COMP-31 | ACE | 82.25 | 0.00 | 0.266 | 0.0033 |
| COMP-32 | CD420 | 82.25 | 0.00 | 0.163 | 0.0051 |
| COMP-33 | DCPA | 82.25 | 0.00 | 0.157 | 0.0049 |
| COMP-34 | TBCH | 82.25 | 0.00 | 0.152 | 0.0048 |
| COMP-35 | SR506D | 82.25 | 0.00 | 0.154 | 0.0048 |
| COMP-36 | SR506D | 82.25 | 0.00 | 0.154 | 0.0048 |
| COMP-37 | SR610 | 82.25 | 0.00 | 0.366 | 0.0028 |
| COMP-38 | SR610/SR506D | 10.00 | 72.25 | 0.179 | 0.0046 |
| COMP-39 | SR610/SR506D | 20.00 | 62.25 | 0.205 | 0.0043 |
| COMP-40 | SR610/SR506D | 50.00 | 32.25 | 0.283 | 0.0036 |
| COMP-41 | SR610/SR238 | 60.00 | 22.25 | 0.344 | 0.0045 |
| COMP-42 | SR610/SR238 | 70.00 | 12.25 | 0.354 | 0.0037 |
| INV-55 | CD9021 | 82.25 | 0.00 | 0.321 | 0.0052 |
| INV-56 | M220 | 82.25 | 0.00 | 0.320 | 0.0067 |
| INV-57 | SR205 | 82.25 | 0.00 | 0.335 | 0.0070 |
| INV-58 | SR206 | 82.25 | 0.00 | 0.323 | 0.0101 |
| INV-59 | SR209 | 82.25 | 0.00 | 0.339 | 0.0061 |
| INV-60 | SR210 | 82.25 | 0.00 | 0.339 | 0.0059 |
| INV-61 | SR213 | 82.25 | 0.00 | 0.323 | 0.0101 |
| INV-62 | SR230 | 82.25 | 0.00 | 0.373 | 0.0093 |
| INV-63 | SR238 | 82.25 | 0.00 | 0.283 | 0.0088 |
| INV-64 | SR238 | 82.25 | 0.00 | 0.283 | 0.0088 |
| INV-65 | SR238 | 82.25 | 0.00 | 0.283 | 0.0088 |
| INV-66 | SR239 | 82.25 | 0.00 | 0.252 | 0.0079 |
| INV-67 | SR259/SR238 | 52.25 | 30.00 | 0.338 | 0.0073 |
| INV-68 | SR259/SR506D | 50.00 | 32.25 | 0.285 | 0.0058 |
| INV-69 | SR272 | 82.25 | 0.00 | 0.372 | 0.0077 |
| INV-70 | SR350 | 82.25 | 0.00 | 0.284 | 0.0089 |
| INV-71 | SR351 | 82.25 | 0.00 | 0.324 | 0.0101 |
| INV-72 | SR492 | 82.25 | 0.00 | 0.306 | 0.0064 |
| INV-73 | SR499 | 82.25 | 0.00 | 0.342 | 0.0054 |
| INV-74 | SR508 | 82.25 | 0.00 | 0.330 | 0.0083 |
| INV-75 | SR9003 | 82.25 | 0.00 | 0.292 | 0.0061 |

TABLE 6-continued

| Inkjet Ink | Polymerizable compound(s) P1 (/P2) | wt % of P1 | wt % of P2 | OFR | WPF |
|---|---|---|---|---|---|
| INV-76 | SR9020HP | 82.25 | 0.00 | 0.336 | 0.0070 |
| INV-77 | VEEA | 82.25 | 0.00 | 0.344 | 0.0054 |

Isola™ 400 copper plates were cleaned in the same manner as in EXAMPLE 1. A pattern of the radiation curable inkjet inks COMP-31 to COMP-42 and INV-55 to INV-77 was coated at a thickness of 10 μm and cured on the cleaned copper plate in the same manner as in EXAMPLE 1.

A first set of these copper plates was then etched and stripped in the same manner as in EXAMPLE 1, the results thereof indicated in Table 7 by Etch Resistance "Acid" respectively Strippability "Acid".

A second set of copper plates made with the radiation curable inkjet inks COMP-31 to COMP-42 and INV-55 to INV-77 was subjected for 60 seconds at 35° C. to an alkaline etch bath Metal etch 50 from Centurion Speciality Chemicals Ltd which contained $NH_4OH$, $NH_4Cl$, $(NH_4)_2CO_3$ and $Cu(NH_4)Cl_3$ at pH 8.5. The plates were subsequently rinsed for 90 seconds with water and dried. The copper plates having their inkjet ink layer not removed during etching were subjected for 5 minutes at 50° C. to an alkaline strip bath (containing 10% Ristoff C-71 from Centurion Speciality Chemicals Ltd which includes 7% ethanolamine, pH 13), then rinsed for 90 seconds with water, dried, and evaluated for strippability. The results of etching and stripping are indicated in Table 7 by Etch Resistance "Alkaline" respectively Strippability "Alkaline".

A third set of copper plates made with the radiation curable inkjet inks COMP-31 to COMP-42 and INV-55 to INV-77 was etched in the same manner as in EXAMPLE 1. A TESAFILM 4014 Black tape (type PV-025-066-B4104 5) from Tesa AG was attached to the pattern of the radiation curable inkjet ink on the copperplate. The tape was then pulled from the copper plate, thereby peeling off the pattern in a number of cases. The strippability results are indicated Table 7 by Strippability "Dry Strip".

TABLE 7

| Inkjet Ink | Etch Resistance | | Strippability | | Dry Strip |
|---|---|---|---|---|---|
| | Acid | Alkaline | Acid | Alkaline | |
| COMP-31 | 100% | 100% | 0% | 0% | 0% |
| COMP-32 | 100% | 100% | 0% | 0% | 0% |
| COMP-33 | 100% | 100% | 0% | 0% | 0% |
| COMP-34 | 100% | 100% | 0% | 0% | 0% |
| COMP-35 | 100% | 100% | 0% | 0% | 0% |
| COMP-36 | 100% | 100% | 0% | 0% | 0% |
| COMP-37 | 0% | 0% | n.a. | n.a. | n.a. |
| COMP-38 | 100% | 100% | 10% | 0% | 0% |
| COMP-39 | 100% | 90% | 20% | 20% | 0% |
| COMP-40 | 30% | 0% | 100% | n.a. | 100% |
| COMP-41 | 0% | 0% | n.a. | n.a. | n.a. |
| COMP-42 | 0% | 0% | n.a. | n.a. | n.a. |
| INV-55 | 100% | 100% | 100% | 100% | 100% |
| INV-56 | 100% | 100% | 100% | 100% | 100% |
| INV-57 | 100% | 100% | 100% | 100% | 100% |
| INV-58 | 100% | 100% | 100% | 100% | 100% |
| INV-59 | 100% | 80% | 100% | 100% | 100% |
| INV-60 | 100% | 80% | 100% | 100% | 100% |
| INV-61 | 100% | 90% | 100% | 100% | 100% |
| INV-62 | 100% | 90% | 100% | 100% | 100% |
| INV-63 | 100% | 80% | 80% | 100% | 100% |
| INV-64 | 100% | 90% | 100% | 90% | 100% |
| INV-65 | 100% | 90% | 100% | 100% | 100% |
| INV-66 | 100% | 100% | 100% | 100% | 100% |
| INV-67 | 100% | 90% | 100% | 100% | 100% |
| INV-68 | 100% | 85% | 100% | 100% | 100% |
| INV-69 | 100% | 90% | 100% | 100% | 100% |
| INV-70 | 100% | 100% | 100% | 100% | 100% |
| INV-71 | 100% | 100% | 100% | 100% | 100% |
| INV-72 | 100% | 100% | 100% | 100% | 100% |
| INV-73 | 100% | 95% | 100% | 100% | 100% |
| INV-74 | 100% | 95% | 100% | 100% | 100% |
| INV-75 | 100% | 100% | 100% | 100% | 100% |
| INV-76 | 100% | 100% | 100% | 100% | 100% |
| INV-77 | 100% | 90% | 100% | 100% | 100% |

Table 7 shows that only the radiation curable inkjet inks wherein the polymerizable composition has an oxygen fraction OFR>0.250 and a weighted polymerizable functionality WPF≥0.0050 supported very different etching and stripping conditions.

Example 4

In Examples 1 to 3, the radiation curable inkjet inks INV-1 to INV-77 provided good to excellent etch resistance and strippability.

The radiation curable inkjet inks COMP-1, COMP-3 to COMP-8, COMP-25, COMP-26, COMP-31 to COMP-36, COMP-37 and COMP-8 exhibited good to excellent etch resistance but no strippability. These inks including a polymerizable composition having an oxygen fraction OFR≤0.250 and a weighted polymerizable functionality WPF≤0.0055, exhibited good etch resistance but no strippability. Although these inks are useless as etch resistant ink for creating a conductive pattern of a printed circuit board, they can be used as a so-callled "legend ink". By printing the legend inkjet ink and the etch resistant inkjet ink simultaneously on a copper plate, with the legend inkjet ink being printed in a position not covering the conductive pattern or copper circuitry, a simpler and cost-effective manufacturing process of printed circuit boards can be realized.

Example 5

This example illustrates the negative effect of acid monomers on the stability and curing speed of radiation curable inkjet inks for making etch resists.

Preparation of the Radiation Curable Inkjet Inks

The radiation curable inkjet inks COMP-43 to COMP-58 and INV-78 to INV-81 were prepared by mixing the components according to Tables 8 to 11. The weight percentages on the total weight of the inkjet ink.

TABLE 8

| wt % of Component: | INV-78 | INV79 | COMP-43 | COMP-44 | COMP-45 |
|---|---|---|---|---|---|
| ITX | 5.00 | 5.0 | 5.00 | 5.00 | 5.00 |
| Irgacure ™ 907 | 5.00 | — | 5.00 | — | 5.00 |
| Irgacure ™ 819 | 3.00 | 3.00 | 3.00 | 3.00 | 3.00 |
| MBF | — | 5.00 | — | 5.00 | — |

TABLE 8-continued

| wt % of Component: | INV-78 | INV79 | COMP-43 | COMP-44 | COMP-45 |
|---|---|---|---|---|---|
| Darocure ™ TPO | 2.00 | 2.00 | 2.00 | 2.00 | 2.00 |
| Inhib-1 | 1.00 | 1.00 | 1.00 | 1.00 | 1.00 |
| Macrolex ™ Blue 3R | 1.75 | 1.75 | 1.75 | 1.75 | 1.75 |
| SR350 | 82.25 | 82.25 | 72.25 | 72.25 | 77.25 |
| SR9054 | — | — | 10.00 | 10.00 | 5.00 |
| MAES | — | — | — | — | — |

TABLE 9

| wt % of Component: | COMP-46 | COMP-47 | COMP-48 | COMP-49 | COMP-50 |
|---|---|---|---|---|---|
| ITX | 5.00 | 5.00 | 5.00 | 5.00 | 5.00 |
| Irgacure ™ 907 | — | 5.00 | — | 5.00 | — |
| Irgacure ™ 819 | 3.00 | 3.00 | 3.00 | 3.00 | 3.00 |
| MBF | 5.00 | — | 5.00 | — | 5.00 |
| Darocure ™ TPO | 2.00 | 2.00 | 2.00 | 2.00 | 2.00 |
| Inhib-1 | 1.00 | 1.00 | 1.00 | 1.00 | 1.00 |
| Macrolex ™ Blue 3R | 1.75 | 1.75 | 1.75 | 1.75 | 1.75 |
| SR350 | 77.25 | 72.25 | 72.25 | 62.25 | 62.25 |
| SR9054 | 5.00 | — | — | — | — |
| MAES | — | 10.00 | 10.00 | 20.00 | 20.00 |

TABLE 10

| wt % of Component: | INV-80 | INV-81 | COMP-51 | COMP-52 | COMP-53 |
|---|---|---|---|---|---|
| ITX | 5.00 | 5.00 | 5.00 | 5.00 | 5.00 |
| Irgacure ™ 907 | 5.00 | — | 5.00 | — | 5.00 |
| Irgacure ™ 819 | 3.00 | 3.00 | 3.00 | 3.00 | 3.00 |
| MBF | — | 5.00 | — | 5.00 | — |
| Darocure ™ TPO | 2.00 | 2.00 | 2.00 | 2.00 | 2.00 |
| Inhib-1 | 1.00 | 1.00 | 1.00 | 1.00 | 1.00 |
| Macrolex ™ Blue 3R | 1.75 | 1.75 | 1.75 | 1.75 | 1.75 |
| SR238 | 30.00 | 30.00 | 25.00 | 25.00 | 27.25 |
| SR259 | 52.25 | 52.25 | 47.25 | 47.25 | 50.00 |
| SR9054 | — | — | 10.00 | 10.00 | 5.00 |
| MAES | — | — | — | — | — |

TABLE 11

| wt % of Component: | COMP-54 | COMP-55 | COMP-56 | COMP-57 | COMP-58 |
|---|---|---|---|---|---|
| ITX | 5.00 | 5.00 | 5.00 | 5.00 | 5.00 |
| Irgacure ™ 907 | — | 5.00 | — | 5.00 | — |
| Irgacure ™ 819 | 3.00 | 3.00 | 3.00 | 3.00 | 3.00 |
| MBF | 5.00 | — | 5.00 | — | 5.00 |
| Darocure ™ TPO | 2.00 | 2.00 | 2.00 | 2.00 | 2.00 |
| Inhib-1 | 1.00 | 1.00 | 1.00 | 1.00 | 1.00 |
| Macrolex ™ Blue 3R | 1.75 | 1.75 | 1.75 | 1.75 | 1.75 |
| SR238 | 27.25 | 25.00 | 25.00 | 20.00 | 20.00 |
| SR259 | 50.00 | 47.25 | 47.25 | 42.25 | 42.25 |
| SR9054 | 5.00 | — | — | — | — |
| MAES | — | 10.00 | 10.00 | 20.00 | 20.00 |

Evaluation

All the radiation curable inkjet inks COMP-43 to COMP-58 and INV-78 to INV-81 had a polymerizable composition having an oxygen fraction OFR>0.250 and a weighted polymerizable functionality WPF≥0.0050. No homogeneous inkjet ink could be prepared for the compositions according to COMP-43 and COMP-45, some components could not be dissolved adequately and therefore no further tests were performed on these inks. All the radiation curable inkjet inks contained no surfactant, yet all had a surface tension between 20 and 40 mN/m measured with a KRÜSS tensiometer K9 from KRÜSS GmbH, Germany at 25° C. after 60 seconds.

The viscosity of inkjet inks was measured directly after preparation and again after a heat treatment of 1 week at 80° C. If an increase in viscosity of 10% or more was observed than the ink received the score "Yes", if no increase or an increase less than 10% was observed than the ink received the score "No. The results are shown in Table 12.

As the curing speed depends highly on the photoinitiators and monomers the radiation curable inkjet inks COMP-43 to COMP-58 were compared with the most comparable reference inkjet inks: INV-78 (Ref. 1), INV-79 (Ref. 2, INV-80 (Ref. 3) and INV-81 (Ref. 4). The results for curing speed are shown in Table 12.

Isola™ 400 copper plates were cleaned in the same manner as in EXAMPLE 1. A pattern of the radiation curable inkjet inks COMP-43 to COMP-58 and INV-78 to INV-81 was coated at a thickness of 10 μm and cured on the cleaned copper plate in the same manner as in EXAMPLE 1. The plates were then etched and stripped in the same manner as in EXAMPLE 1. Excellent etch resistance was observed for all inkjet inks. The results of strippability are shown in Table 12.

TABLE 12

| Inkjet Ink | OFR | WFR | Initial Viscosity (mPa·s) | 1 week at 80° C. | Curing speed Versus | Loss? | Strippability |
|---|---|---|---|---|---|---|---|
| INV-78 | 0.284 | 0.0089 | 19.5 | No | Ref. 1 | n.a. | 100% |
| INV-79 | 0.284 | 0.0089 | 16.1 | No | Ref. 2 | n.a. | 100% |
| COMP-43 | 0.298 | 0.0086 | Inhomogeneous inkjet ink | | | | |
| COMP-44 | 0.298 | 0.0086 | 25.4 | Yes | Ref. 2 | No | 40% |
| COMP-45 | 0.291 | 0.0087 | Inhomogeneous inkjet ink | | | | |
| COMP-46 | 0.291 | 0.0087 | 21.7 | Yes | Ref. 2 | No | 0% |
| COMP-47 | 0.300 | 0.0083 | 22.4 | Solid | Ref. 1 | No | 10% |
| COMP-48 | 0.300 | 0.0083 | 20.2 | Solid | Ref. 2 | No | 20% |
| COMP-49 | 0.316 | 0.0078 | 25.6 | Solid | Ref. 1 | No | 40% |
| COMP-50 | 0.316 | 0.0078 | 20.7 | Solid | Ref. 2 | No | 60% |
| INV-80 | 0.338 | 0.0074 | 8.7 | No | Ref. 3 | n.a. | 100% |
| INV-81 | 0.338 | 0.0074 | 8.3 | No | Ref. 4 | n.a. | 100% |
| COMP-51 | 0.346 | 0.0072 | 16.0 | Yes | Ref. 3 | Yes | 100% |
| COMP-52 | 0.346 | 0.0072 | 10.7 | Yes | Ref. 4 | Yes | 100% |
| COMP-53 | 0.342 | 0.0073 | 12.2 | Yes | Ref. 3 | Yes | 100% |
| COMP-54 | 0.342 | 0.0073 | 9.0 | Yes | Ref. 4 | Yes | 100% |
| COMP-55 | 0.349 | 0.0069 | 10.9 | Yes | Ref. 3 | No | 100% |
| COMP-56 | 0.349 | 0.0069 | 10.0 | No | Ref. 4 | Yes | 100% |
| COMP-57 | 0.360 | 0.0065 | 13.9 | No | Ref. 3 | Yes | 100% |
| COMP-58 | 0.360 | 0.0065 | 11.9 | No | Ref. 4 | Yes | 100% |

From Table 12, it should be clear that inkjet printing with high stability at high curing speed was only possible with radiation curable inkjet inks INV-78 to INV-81 which had a polymerizable composition having an oxygen fraction OFR>0.250 and a weighted polymerizable functionality WPF≥0.0050 and a polymerizable composition containing no polymerizable compound with an ethylenic double bond and including a phosphoester group or a carboxylic acid group in the molecule thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A method of inkjet printing comprising the steps of:
    a) forming protected areas on a metal surface by printing and curing a radiation curable inkjet ink on the metal surface;
    b) removing metal from unprotected areas of the metal surface by etching; and
    c) removing at least partially the radiation curable inkjet ink cured on the metal surface from the protected areas of the metal surface; wherein
    the radiation curable inkjet ink includes at least 70 percent by weight of a polymerizable composition based on a total weight of the radiation curable inkjet ink;
    the polymerizable composition has an oxygen fraction OFR>0.250 and a weighted polymerizable functionality WPF≥0.0050;

$$OFR = \sum_{i=1}^{n} \frac{15.9994 \times N_{O,i} \times \% \ wt_i}{MW_i \times \% \ wt_P}$$

$$WPF = \sum_{i=1}^{n} \frac{N_{P,i} \times \% \ wt_i}{MW_i \times \% \ wt_P}$$

n=a number of polymerizable compounds in the polymerizable composition having a different chemical structural formula from each other;

$N_{O,i}$=a number of oxygen atoms in polymerizable compound i; $N_{P,i}$=a number of polymerizable groups in the polymerizable compound i;

$MW_i$=a molecular weight of the polymerizable compound i; $\% \ wt_i$=a weight percentage of the polymerizable compound i based on the total weight of the radiation curable inkjet ink; $\% \ wt_P$=a weight percentage of the polymerizable composition based on the total weight of the radiation curable inkjet ink; and the radiation curable inkjet ink contains no polymerizable compound with an ethylenic double bond including a phosphoester group and contains no polymerizable compound with an ethylenic double bond and a carboxylic acid group.

2. The method according to claim 1, further comprising the step of cleaning the metal surface before printing the radiation curable inkjet ink.

3. The method according to claim 1, wherein the metal surface contains copper.

4. The method according to claim 1, wherein the radiation curable inkjet ink cured on the metal surface is removed from the protected areas in step c) by an alkaline stripping bath.

5. The method according to claim 1, wherein the radiation curable inkjet ink cured on the metal surface is removed from the protected areas in step c) by dry delamination.

6. The method according to claim 1, wherein the radiation curable inkjet ink includes a colorant.

7. The method according to claim 1, wherein a conductive pattern is formed.

8. The method according to claim 1, wherein a decorative etched metal panel is formed.

* * * * *